United States Patent
Zschieschang et al.

(10) Patent No.: US 9,042,103 B2
(45) Date of Patent: May 26, 2015

(54) POWER SEMICONDUCTOR MODULE WITH ASYMMETRICAL LEAD SPACING

(75) Inventors: Olaf Zschieschang, Viernheim (DE); Andreas Laschek-Enders, Bensheim (DE)

(73) Assignee: IXYS Semiconductor GmbH, Lampertheim (DE)

( * ) Notice: Subject to any disclaimer, the term of this patent is extended or adjusted under 35 U.S.C. 154(b) by 446 days.

(21) Appl. No.: 13/472,725

(22) Filed: May 16, 2012

(65) Prior Publication Data
US 2013/0021759 A1    Jan. 24, 2013

(51) Int. Cl.
*H05K 7/00*     (2006.01)
*H01L 23/373*   (2006.01)
*H01L 23/057*   (2006.01)
*H01L 23/31*    (2006.01)

(52) U.S. Cl.
CPC .......... *H01L 23/3735* (2013.01); *H01L 23/057* (2013.01); *H01L 23/3121* (2013.01); *H01L 2924/0002* (2013.01)

(58) Field of Classification Search
USPC ......... 361/716, 717, 728–730, 723, 813, 773; 257/777, 778
See application file for complete search history.

(56) References Cited

U.S. PATENT DOCUMENTS

| | | | | |
|---|---|---|---|---|
| 5,471,089 A | * | 11/1995 | Nagatomo et al. | 257/691 |
| 5,767,573 A | | 6/1998 | Noda et al. | |
| 6,040,626 A | * | 3/2000 | Cheah et al. | 257/735 |
| 6,933,593 B2 | * | 8/2005 | Fissore et al. | 257/675 |
| 7,148,562 B2 | * | 12/2006 | Yoshida et al. | 257/675 |
| 7,173,333 B2 | * | 2/2007 | Hata et al. | 257/713 |
| 7,545,033 B2 | * | 6/2009 | Grant | 257/706 |
| 2006/0267185 A1 | | 11/2006 | Lindemann | |
| 2010/0140786 A1 | | 6/2010 | Lee et al. | |

FOREIGN PATENT DOCUMENTS

WO    WO03071601 A2    8/2003

OTHER PUBLICATIONS

International Search Report for European Patent Office application EP12003854 (Sep. 25, 2012).

* cited by examiner

*Primary Examiner* — Hung S Bui
(74) *Attorney, Agent, or Firm* — Imperium Patent Works; Amir V. Adibi

(57) ABSTRACT

A power semiconductor has power terminals arranged in a row at one side of the housing, with control terminals arranged in a row at the other side of the housing. The spacing between adjacent power terminals is greater than the spacing between adjacent control terminals.

20 Claims, 2 Drawing Sheets

MOUNTING FIRST AND SECOND POWER
SEMICONDUCTOR COMPONENTS ONTO CARRIER BOARD

POWER SEMICONDUCTOR MODULE WITH ASYMMETRICAL LEAD SPACING

BACKGROUND OF THE INVENTION

The invention concerns a power semiconductor with a housing, and power and control terminals. Power semiconductors, which include, for example, well-known IGBTs, are used in various fields of electrical engineering, such as drive control units for electric motors.

Power semiconductor modules are known, for example, from EP 0 513 410 B1 and DE 196 46 396 C2, each of them having an electrically insulating substrate on which a circuit arrangement is placed with power semiconductor components. The substrate forms the base of a plastic housing that encloses the circuit arrangement. The electrical power terminals of the semiconductor components that make contact with the circuit arrangement extend through the housing to the outside. The housing is filled with casting compound to protect the circuit arrangement. Fastening points on the housing are used to screw the module together with a heat dissipating body.

EP 1 976 358 B1 describes a power semiconductor that has a carrier board of an insulating ceramic substrate, forming the base of the housing. The carrier board is provided with a metal layer at the top and bottom side, while the top metal layer is structured to form conductor tracks. The conductor tracks are electrically connected to a power semiconductor component, and the power and control terminals of the semiconductor component. The power and control terminals are led out from the housing at the side. The power and control terminals of the power semiconductor are configured as terminals of a surface-mounted component, also known as a SMD (Surface-Mounted Device). The SMD component is mounted on a circuit board.

To maintain the insulation distances required for electrical operation as air and creep distances between the segments of the power and control terminals situated inside the housing and the carrier board, and between the segments of the power and control terminals situated outside the housing and the carrier board, the power and control terminals have a particular configuration. The terminals inside the housing at first extend perpendicularly away from the carrier board, then to the side through the housing to the outside, and finally perpendicular to the circuit board. All power and control terminals have the same spacing.

SUMMARY OF THE INVENTION

One goal of the invention is to provide a power semiconductor with improved technical properties. The power semiconductor of a preferred embodiment has a carrier board on which at least one power semiconductor component is arranged. The carrier board with the at least one power semiconductor component is at least partly enclosed by a housing. Power and control terminals are electrically connected to the at least one power semiconductor component and led out from the housing.

The power semiconductor of the preferred embodiment has power terminals arranged in a row at one side of the housing, with control terminals arranged in a row at the other side of the housing. The spacing between adjacent power terminals is greater than the spacing between adjacent control terminals. The special arrangement of the power and control terminals at the two sides of the housing provides improved electrical properties, especially when used with high voltages and currents. This also provides insulation distances for air and creep spacing that are larger than in known power semiconductors.

In one preferred embodiment, the power terminals have a larger cross section than the control terminals, thereby making the power semiconductor suitable for switching large currents. In addition to the above arrangement of the power and control terminals, critical air or creep spacings are avoided by the special configuration of the terminals themselves. The power and control terminals in another preferred embodiment have a first segment that extends out from the housing at the side, a second segment that extends from the first segment to the circuit board, and a third segment that extends from the second segment sideways to the outside. Preferably, the individual segments subtend an angle of about 90°.

Several power semiconductor components can be arranged on the carrier board. An especially preferred embodiment has an arrangement of two power semiconductor components on the carrier board. The power semiconductor components have common power terminals, which are arranged on one side of the housing, and separate control terminals, which are arranged on the other side of the housing. The control terminals assigned to the first power semiconductor component are arranged alongside each other in a first row of the housing and the control terminals assigned to the second power semiconductor component are arranged alongside each other in a second row. Preferably, the spacing between the first row and the second row of control terminals is greater than the spacing between adjacent control terminals in the first and second row. With this arrangement, the control terminals are divided into individual groups, each group of terminals being assigned to only one power semiconductor. This assures that the control terminals of different groups, which may differ greatly from each other in electrical potential, are arranged at a sufficient insulation distance, while the control terminals of a group that differ less so from each other in terms of electrical potential are arranged more closely together. The distance between the first row and the second row of control terminals can be the same as, or smaller than, the distance between adjacent power terminals. For mounting on a heat dissipating body, the side of the board facing the heat dissipating body is preferably flush with the housing.

Among the benefits of this structure are that it makes little or no difference as to the type of components of the power semiconductor modules. For example, the power semiconductor modules can be Insulated Gate Bipolar Transistors (IGBTs), but also metal oxide semiconductor field effect transistors (MOSFETs), or other known power semiconductor components.

A sample embodiment of the invention is explained more closely below, making reference to the figures.

DETAILED DESCRIPTION OF THE PREFERRED EMBODIMENTS

Figure 1:
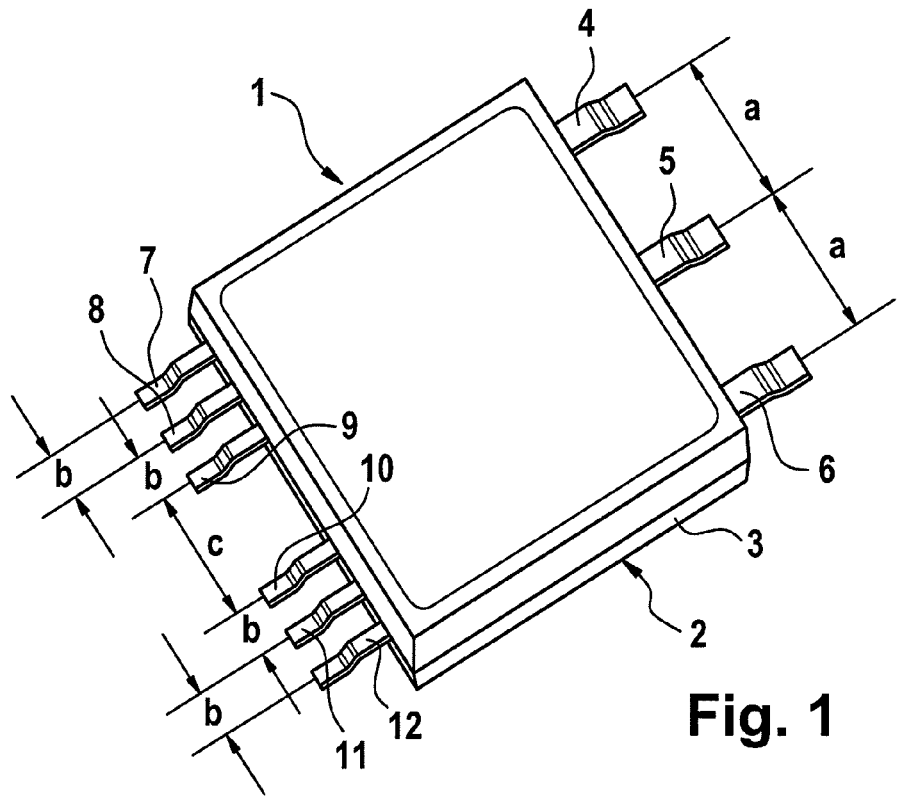
FIG. 1 illustrates an embodiment of the power semiconductor in a perspective representation from above.
Figure 2:
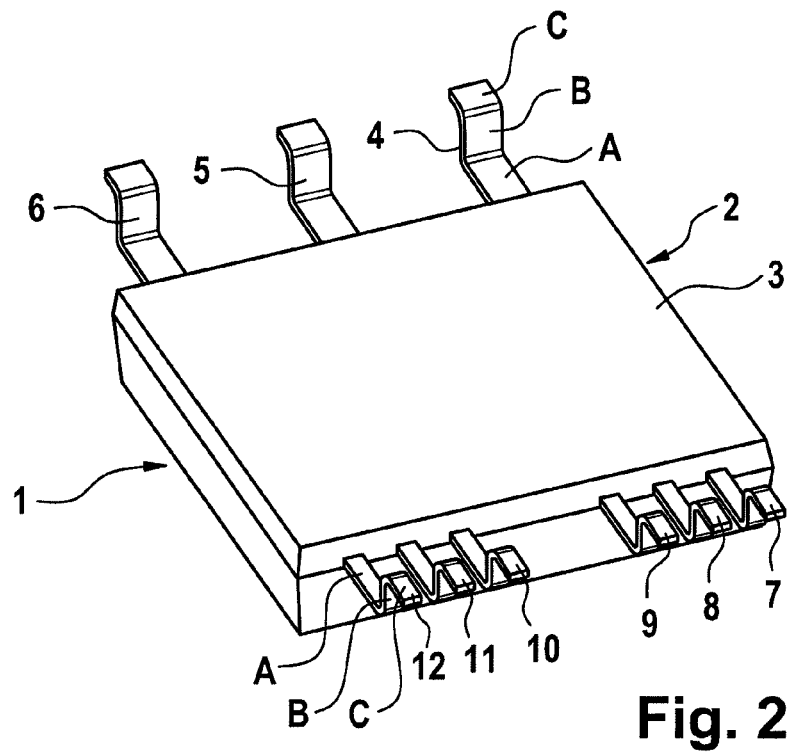
FIG. 2 is a bottom view of the power semiconductor of FIG. 1.
Figure 3:
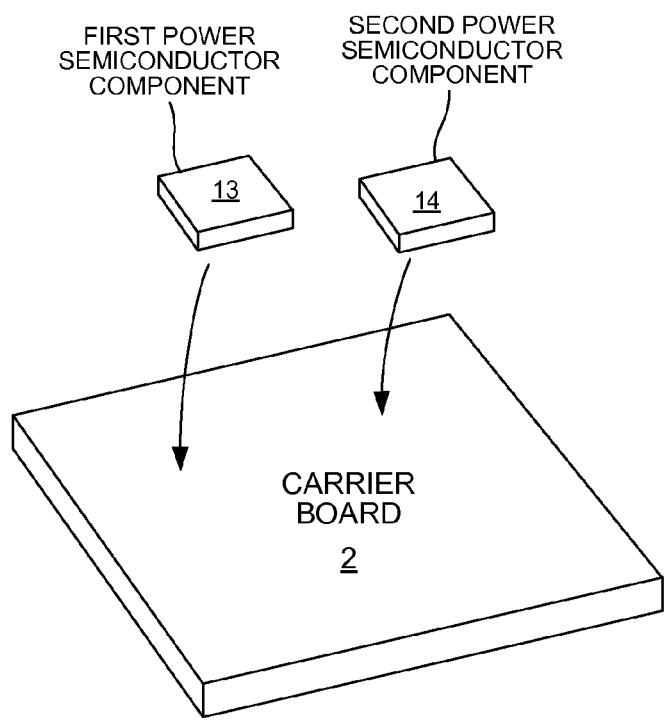
FIG. 3 is a diagram showing the first and second power semiconductor components 13 and 14 being mounted onto the carrier board 2.

The power semiconductor component according to a preferred embodiment of this invention includes a housing 1, which preferably consists of an insulating material, such as an epoxy compound. The housing 1, however, can also be made at least partly of metal. FIGS. 1 and 2 show the housing of the power semiconductor from different views. Because power semiconductors are well known, we do not herein explain the power semiconductor components or their interconnect structure inside the housing. In the illustrated embodiment, the flat rectangular housing has dimensions of 25 mm×23 mm×5.5 mm.

The housing 1 partly encloses a carrier board 2 of an insulating ceramic substrate, wherein the carrier board 2 forms the base 3 of the housing 1. The carrier board 2 is provided with a metal layer on both the side facing the housing and the side away from the housing. The metal layer facing the housing is structured according to the conductor tracks of a circuit arrangement. On this structured metal layer are arranged, in the present embodiment, two power semiconductor components such as Insulated Gate Bipolar Transistors (IGBTs), not shown in the figures. The power semiconductor components can be soldered, or otherwise attached, to the structured metal layer at the bottom side. On the top side, the power semiconductor components are electrically connected by means of bonding wires to the conductor tracks of the structured metal layer, while the opposite ends of the bonding wires are soldered to the power semiconductor components. The power semiconductor is mounted on a heat dissipating body (not shown), and the base 3 of the housing lies on the heat dissipating body.

Both of the power semiconductor modules have power terminals 4, 5, and 6 and control terminals 7, 8, 9, 10, 11, and 12. The power terminals 4, 5, and 6 of the two power semiconductor components within the package of the illustrated embodiment are assembled to have three common power terminals, which are led out from the housing 1 at the side. Each of the two power semiconductor components, however, has three separate control terminals 7, 8, and 9 in one case and 10, 11, and 12, in the other case, which are likewise led out from the housing 1. The power and control terminals 4 to 12 are bracket-shaped terminals which are preferably configured as terminals of a surface-mounted device (SMD).

All terminals have a first segment A, which extends out from the housing 1 at the side. The first segment A adjoins a second segment B which subtends an angle of about 90° with the first segment. The second segment B passes into an outwardly pointing third segment C, which again subtends an angle of around 90° with the second segment B. The third segment of each terminal is electrically connected to the circuit board (not shown). Typically, the power terminals 4, 5, and 6 differ in their cross section from the control terminals 7, 8, 9, 10, 11, and 12, with the power terminals 4, 5, and 6 having a larger cross section than the control terminals 7, 8, 9, 10, 11, and 12.

The power terminals 4, 5, and 6 are arranged in a row at equal spacings "a" on one lengthwise side of the housing, while the neighboring control terminals 7, 8, 9, 10, 11, and 12 are arranged in a row at the other lengthwise side of the housing in a spacing "b". The spacing "a" between the adjacent power terminals 4, 5, and 6 is larger than the spacing of the outer power terminals and the edges of the housing. The adjacent control terminals 7, 8, 9, 10, 11, and 12 of the two power semiconductor components form a first group 7, 8, and 9 and a second group 10, 11, and 12, which are arranged alongside each other at the other lengthwise side of the housing 1 in a spacing "c" that is larger than the spacing "b" between the adjacent control terminals of a group. The spacing "c" corresponds to the spacing "a" or can be less than the spacing "a". With both the special arrangement and the special configuration of the power and control terminals, sufficient air and creep distances are created for the electrical operation at high voltage and current, so that the electrical properties of the semiconductor component are improved.

What is claimed is:

1. A power semiconductor module comprising:
   a carrier board;
   a first power semiconductor component having power and control terminals, the first power semiconductor component being mounted on the carrier board;
   a second power semiconductor component having power and control terminals, the second power semiconductor component also being mounted on the carrier board;
   the power terminals of the first power semiconductor component being commonly coupled to the power terminals of the second semiconductor component;
   a housing having an upper surface, a lower surface and sides, the housing enclosing each of the first and second power semiconductor components and at least partly enclosing the carrier board;
   a plurality of electrically conductive leads connected to corresponding ones of the power and control terminals and extending to outside the housing; and wherein:
   the power terminals are arranged in a row along one side of the housing;
   the control terminals are arranged in a row along an opposite side of the housing; and
   a spacing between adjacent power terminals is greater than spacings between adjacent control terminals, wherein:
   the control terminals of the first power semiconductor component form a first group of control terminals and are arranged alongside each other;
   the control terminals of the second power semiconductor component form a second group of control terminals and are arranged alongside each other; and
   one of the control terminals of the first group of control terminals is spaced further apart from an adjacent one of the control terminals of the second group of control terminals than the spacing between adjacent control terminals of the first group of control terminals.

2. The power semiconductor module of claim 1, wherein the power terminals have a larger cross sectional area than the control terminals.

3. The power semiconductor module of claim 1, wherein each of the power terminals and each of the control terminals comprises:
   a first segment that extends outward from the housing;
   a second segment that extends downward from the first segment; and
   a third segment that extends outward from the second segment.

4. The power semiconductor module of claim 3, wherein the second segment subtends an angle of approximately 90 degrees from the first segment, and wherein the third segment subtends an angle of approximately 90 degrees from the second segment.

5. The power semiconductor module of claim 1, wherein at least one of the first and second power semiconductor components comprises an Insulated Gate Bipolar Transistor (IGBT).

6. The power semiconductor module of claim 1, wherein the power terminals of the first power semiconductor component are connected to the power terminals of the second power semiconductor component, and wherein the control terminals of the first power semiconductor component are not connected to the control terminals of the second power semiconductor component.

7. The power semiconductor module of claim 1, wherein the power semiconductor module is a surface-mounted device (SMD).

8. A packaged electronic device comprising:
a first power semiconductor component having power and control terminals;
a second power semiconductor component having power and control terminals;
a carrier board, wherein the first power semiconductor component is disposed on the carrier board, and wherein the second power semiconductor component is disposed on the carrier board;
a housing that encapsulates each of the first and second power semiconductor components and that partially encapsulates the carrier board, wherein the housing has a first side and a second side, and wherein the first side of the housing is opposite the second side of the housing;
a first plurality of electrically conductive leads arranged along the first side of the housing, wherein the first plurality of electrically conductive leads extends outside the housing, wherein the first plurality of electrically conductive leads is coupled to the power terminals of the first power semiconductor component, and wherein the first plurality of electrically conductive leads is coupled to the power terminals of the second power semiconductor component;
a second plurality of electrically conductive leads arranged along the second side of the housing, wherein the second plurality of electrically conductive leads extends outside the housing, and wherein the second plurality of electrically conductive leads is coupled to the control terminals of the first power semiconductor component; and
a third plurality of electrically conductive leads arranged along the second side of the housing, wherein the third plurality of electrically conductive leads extends outside the housing, wherein the third plurality of electrically conductive leads is coupled to the control terminals of the second power semiconductor component, and wherein a spacing between an electrically conductive lead of the second plurality of electrically conductive leads and an adjacent electrically conductive lead of the third plurality of electrically conductive leads is less than or equal to a spacing between electrically conductive leads of the first plurality of electrically conductive leads.

9. The packaged electronic device of claim 8, wherein each of the first plurality of electrically conductive leads has a larger cross sectional area than each of the second plurality of electrically conductive leads, and wherein each of the first plurality of electrically conductive leads has a larger cross sectional area than each of the third plurality of electrically conductive leads.

10. The packaged electronic device of claim 8, wherein each of the first, second, and third plurality of electrically conductive leads comprises:
a first segment that extends outward from the housing;
a second segment that adjoins the first segment, wherein the second segment subtends an angle of approximately 90 degrees from the first segment; and
a third segment that adjoins the second segment, wherein the third segment subtends an angle of approximately 90 degrees from the second segment.

11. The packaged electronic device of claim 8, wherein the first power semiconductor component is a first Insulated Gate Bipolar Transistor (IGBT), and wherein the second power semiconductor component is a second IGBT.

12. The packaged electronic device of claim 8, wherein the packaged electronic device is a surface-mounted device (SMD).

13. The packaged electronic device of claim 8, wherein the power terminals of the first power semiconductor component are connected to the power terminals of the second power semiconductor component, and wherein the control terminals of the first power semiconductor component are not connected to the control terminals of the second power semiconductor component.

14. A power semiconductor module comprising:
a first Insulated Gate Bipolar Transistor (IGBT), wherein the first IGBT has power terminals and control terminals;
a second Insulated Gate Bipolar Transistor (IGBT), wherein the second IGBT has power terminals and control terminals;
a carrier board, wherein the first IGBT and the second IGBT are arranged on the carrier board;
a housing that encloses the first IGBT, the second IGBT, and partially encloses the carrier board, wherein the housing has a first side and a second side, and wherein the first side of the housing is opposite the second side of the housing;
a plurality of power terminals arranged along the first side of the housing, wherein each of the plurality of power terminals is a distance A apart from an adjacent one of the plurality of power terminals, wherein the plurality of power terminals extends outside the housing, wherein the plurality of power terminals is connected to the power terminals of the first IGBT, and wherein the plurality of power terminals is also connected to the power terminals of the second IGBT;
a first plurality of control terminals arranged along the second side of the housing, wherein each of the first plurality of control terminals is a distance B apart from an adjacent one of the first plurality of control terminals, wherein the distance B is less than the distance A, wherein the first plurality of control terminals extends outside the housing, and wherein the first plurality of control terminals is connected to the control terminals of the first IGBT; and
a second plurality of control terminals arranged along the second side of the housing, wherein each of the second plurality of control terminals is the distance B apart from an adjacent one of the second plurality of control terminals, wherein one of the second plurality of control terminals is a distance C apart from an adjacent one of the first plurality of control terminals, wherein the second plurality of control terminals extends outside the housing, wherein the second plurality of control terminals is connected to the control terminals of the second IGBT, and wherein the distance C is less than or equal to the distance A.

15. The power semiconductor module of claim 14, wherein each of the plurality of power terminals has a larger cross sectional area than each of the first plurality of control terminals, and wherein each of the plurality of power terminals has a larger cross sectional area than each of the second plurality of control terminals.

16. The power semiconductor module of claim 14, wherein each of the plurality of power terminals, the first plurality of control terminals, and the second plurality of control terminals comprises:
a first segment that extends outward from the housing;

a second segment that adjoins the first segment, wherein the second segment subtends an angle of approximately 90 degrees from the first segment; and a third segment that adjoins the second segment, wherein the third segment subtends an angle of approximately 90 degrees from the second segment.

17. The power semiconductor module of claim 14, wherein the power semiconductor module is a surface-mounted device (SMD).

18. The packaged electronic device of claim 14, wherein the power terminals of the first IGBT are connected to the power terminals of the second IGBT, and wherein the control terminals of the first IGBT are not connected to the control terminals of the second IGBT.

19. The power semiconductor module of claim 14, wherein the distance A is at least twice as great as the distance B.

20. The power semiconductor module of claim 14, wherein the distance C is less than the distance A.

\* \* \* \* \*